US010930742B2

(12) United States Patent
Kazemi et al.

(10) Patent No.: US 10,930,742 B2
(45) Date of Patent: Feb. 23, 2021

(54) WAFER STRUCTURE WITH MODE SUPPRESSION

(71) Applicant: RAYTHEON COMPANY, Waltham, MA (US)

(72) Inventors: Hooman Kazemi, Waltham, MA (US); Mark Rosker, Waltham, MA (US); Thomas E. Kazior, Waltham, MA (US); Shane A. O'Connor, Waltham, MA (US); Emily Elswick, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/821,559

(22) Filed: Mar. 17, 2020

(65) Prior Publication Data

US 2020/0219982 A1    Jul. 9, 2020

Related U.S. Application Data

(62) Division of application No. 15/827,349, filed on Nov. 30, 2017, now abandoned.

(51) Int. Cl.
*H01L 23/482*    (2006.01)
*H01L 23/552*    (2006.01)
(Continued)

(52) U.S. Cl.
CPC .............. *H01L 29/20* (2013.01); *H01L 23/29* (2013.01); *H01L 23/4822* (2013.01); *H01L 23/5384* (2013.01); *H01L 23/552* (2013.01)

(58) Field of Classification Search
CPC ..... H01L 29/20; H01L 23/4822; H01L 23/29; H01L 23/552; H01L 23/5384;
(Continued)

(56) References Cited

U.S. PATENT DOCUMENTS 3,659,035 A * 4/1972 Planzo ................. H01L 23/498
174/528
4,551,747 A   11/1985 Gilbert et al.
(Continued)

OTHER PUBLICATIONS

Dylan F. Williams; "Damping of the Resonant Modes of a Rectangular Metal Package;" IEEE Transactions on Microwave Theory and Techniques; vol. 37, No. 1; Jan. 1989; pp. 253-256.
(Continued)

*Primary Examiner* — Steven H Loke
*Assistant Examiner* — Juanita B Rhodes
(74) *Attorney, Agent, or Firm* — Burns & Levinson, LLP; Joseph M. Maraia

(57) ABSTRACT

A reconstituted wafer includes a plurality of apertures defined in a first substrate. A module is positioned in each aperture and coupled to circuit traces on the first substrate by operation of beam leads extending from the module. A second substrate is positioned over the first substrate and each module is enclosed in a space defined by the respective aperture and the second substrate. The module includes a lid and at least one mode suppression circuit disposed in the lid. The modules may include an invariant die where different technologies are stacked together.

8 Claims, 15 Drawing Sheets

(51) Int. Cl.
  *H01L 23/538* (2006.01)
  *H01L 29/20* (2006.01)
  *H01L 23/29* (2006.01)
(58) Field of Classification Search
  CPC . H01L 21/50; H01L 23/10; H01L 2223/6683; H01L 23/66; H01L 23/04; H01L 23/13; H05K 3/3426; H05K 1/183
  See application file for complete search history.

(56) References Cited

U.S. PATENT DOCUMENTS

| | | | |
|---|---|---|---|
| 6,191,666 B1 | 2/2001 | Sheen | |
| 6,316,822 B1 | 11/2001 | Venkateshwaran et al. | |
| 6,603,376 B1 | 8/2003 | Handforth et al. | |
| 7,615,863 B2 | 11/2009 | Yang et al. | |
| 8,598,465 B2 | 12/2013 | Eaves et al. | |
| 8,816,798 B2 | 8/2014 | McKinzie, III | |
| 2004/0178501 A1 | 9/2004 | Son et al. | |
| 2006/0050010 A1* | 3/2006 | Choi | H01Q 15/006 343/909 |
| 2007/0262836 A1* | 11/2007 | Voss | H01P 3/088 333/247 |
| 2007/0273008 A1* | 11/2007 | Suzuki | H01L 23/552 257/659 |
| 2008/0310191 A1* | 12/2008 | Zhu | H03K 5/1532 363/21.04 |
| 2011/0089531 A1 | 4/2011 | Hillman et al. | |
| 2011/0181376 A1 | 7/2011 | Vanhille et al. | |
| 2012/0062346 A1* | 3/2012 | McKinzie, III | H01P 3/082 333/251 |
| 2012/0194291 A1* | 8/2012 | Pajovic | H01P 1/2005 333/12 |

OTHER PUBLICATIONS

Doug Henke et al.; "Mode Suppressing Packaging for 50 GHz Cryogenic Low-Noise Amplifiers;" Proceedings of the 7th European Microwave Integrated Circuits Conference; 2012; pp. 623-626.

* cited by examiner

WAFER STRUCTURE WITH MODE SUPPRESSION

RELATED APPLICATION

This application is a divisional application of U.S. non-provisional application Ser. No. 15/827,349, filed Nov. 30, 2017 entitled "Reconstituted Wafer Structure," the entire contents of which is incorporated by reference for all purposes.

BACKGROUND

With improvements in transistor processes and higher frequencies of operation, the functionality of integrated circuits has increased and a variety of silicon-based System-on-Chips (SOC) have been demonstrated. Although the functional density of such advanced integrated circuits has increased significantly, when packing various capabilities into a single chip, they inherently suffer from a performance/integration tradeoff. Silicon and SiGe foundry services provide multi-dimensional capabilities for design of such SOCs, however, they suffer from a lack of high end performance features compared to III-V transistors such as GaN, GaAs, InP and others. These Silicon-based SOCs suffer from a lack of output power and gain, a lower operating frequency range, a poor noise figure and a smaller dynamic range, thus limiting their use in high end system insertions.

Multiple attempts have been made to combine Si-based integrated circuits with III-V technologies. Wafer-to-wafer or wafer-to-large-die bonding of dissimilar technologies have been demonstrated with various success rates. Even so, these examples have been only demonstrated with one III-V technology wafer and a Si-based foundry wafer. These are complex additive processes and are not scalable in scope beyond the two-technologies.

What is needed is an approach to increase the functional performance of systems using dissimilar technologies.

SUMMARY

According to one aspect of the disclosure, there is a wafer structure comprising: a first planar structure having a plurality of apertures defined therein; at least one module positioned with respect to one of the apertures, the at least one module having a plurality of beam leads coupled to the first planar structure; and a second planar structure disposed on a first surface of the first planar structure to define a closed space about the at least one module. The at least one module comprises: a first circuit layer; a second circuit layer coupled to the first circuit layer; a lid; and at least one mode suppression circuit disposed in the lid, wherein at least one of the first and second circuit layers is coupled to at least one of the plurality of beam leads.

In another aspect of the present disclosure, there is a device, comprising: a first planar structure having a first surface; a first aperture defined in the first surface of the first planar structure; a first module having a plurality of co-planar leads extending therefrom, wherein the plurality of co-planar leads is coupled to the first surface of the first planar structure to position the first module in the first aperture; a second planar structure disposed on the first surface of the first planar structure, wherein a closed space is defined about the first module by the first and second planar structures and the first aperture. The first module comprises: a lid; and at least one mode suppression circuit disposed in the lid.

BRIEF DESCRIPTION OF THE DRAWINGS

Various aspects of the disclosure are discussed below with reference to the accompanying Figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The Figures are provided for the purposes of illustration and explanation and are not intended as a definition of the limits of the disclosure. In the Figures.

DETAILED DESCRIPTION

Figure 1A:
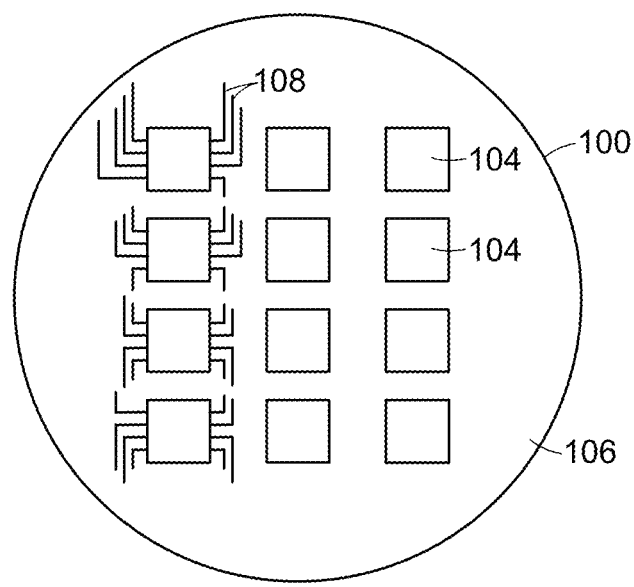
FIGS. 1A and 1B are representations of a first substrate of an aspect of the wafer structure of the present disclosure.

This application is a divisional application of U.S. nonprovisional application Ser. No. 15/827,349, filed Nov. 30, 2017, entitled "Reconstituted Wafer Structure," the entire contents of which is incorporated by reference for all purposes.

In the following detailed description, details are set forth in order to provide a thorough understanding of the aspects of the disclosure. It will be understood by those of ordinary skill in the art that these may be practiced without some of these specific details. In other instances, well-known methods, procedures, components and structures may not have been described in detail so as not to obscure the aspects of the disclosure.

It is to be understood that the disclosure is not limited in its application to the details of construction and the arrangement of the components set forth in the following description or illustrated in the drawings as it is capable of implementations or of being practiced or carried out in various ways. Also, it is to be understood that the phraseology and terminology employed herein are for the purpose of description only and should not be regarded as limiting.

Certain features, which are, for clarity, described in the context of separate implementations, may also be provided in combination in a single implementation. Conversely, various features, which are, for brevity, described in the context of a single implementation, may also be provided separately or in any suitable sub-combination.

Generally, and as will be described in more detail below, aspects of the present disclosure provide a scalable and flexible process in which multiple circuits of different technologies can be integrated at a die or wafer scale and which leverages existing manufacturing techniques. Advantageously, aspects of the present disclosure are scalable to the wafer level by encapsulating circuits of various technologies on the same wafer which removes the constraints of tight tolerances required by other processes and allows for multiple technologies to be integrated together.

In another aspect, a "reconstituted" wafer assembly includes various modules of different technologies, for example, IC, SOC, etc., that are attached in micro-machined apertures, alternately referred to as cavities, or openings, provided in a wafer. A similarly sized wafer level lid with various incorporated interconnects encapsulates the various modules in a hermetically sealed space. Any commercial-off-the-shelf (COTS) die where multi-layer tiers provide a micro-package around the COTS die for the reconstituted wafer assembly can be leveraged to contribute to a high yield unconstrained process. In addition, double sided interconnects, III-V IC gold encapsulation for Silicon fab processes and various material capabilities for different tiers of the stack, independent of the wafer level assembly restrictions can be obtained.

Figure 1B:
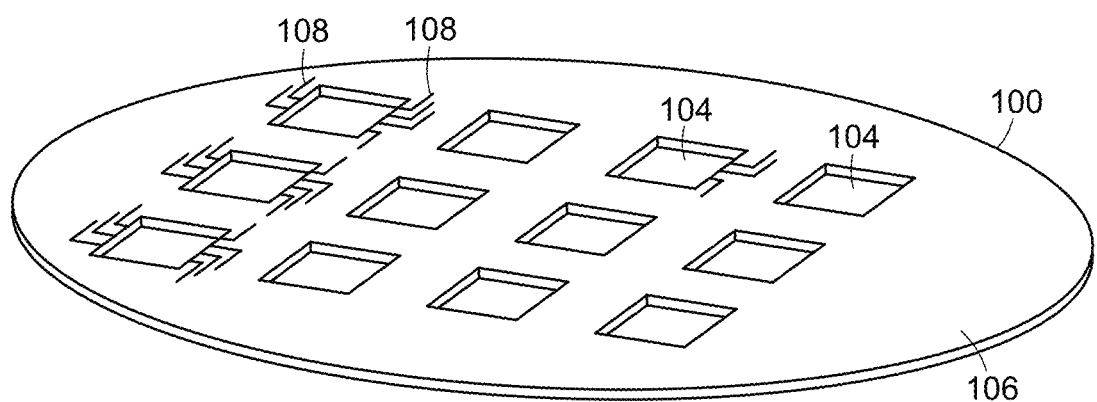

Referring now to FIGS. 1A and 1B, a planar first structure 100 is provided. The planar first structure 100 may be circular and of a diameter that is similar to known wafers, for example, eight or twelve inches. The planar first structure 100 may be a substrate made from Silicon or other similar material. A plurality of apertures 104 are provided in the first structure 100. The apertures 104 may be implemented either as an opening that goes through the first structure 100 or a closed cavity and may be created by micro-machining or any other known approach. The apertures 104 are arranged in such a way so as to facilitates separation, for example, by cutting, in accordance with known wafer-processing techniques. A top surface 106 of the first structure 100 may include a plurality of traces 108 to facilitate the distribution of electrical signals, for example, I/O signals.

Figure 2:
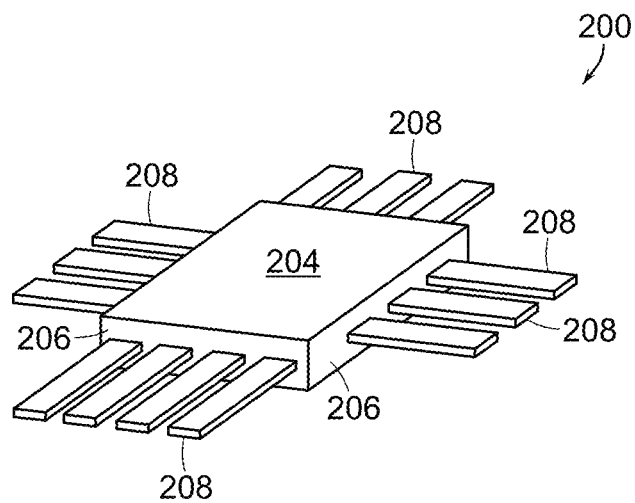
FIG. 2 is a representations of a module for positioning in the first substrate.

A module 200, as shown in FIG. 2, includes a body portion 204 having sidewalls 206. A plurality of beam leads 208 extends from one or more of the sidewalls 206. Each beam lead 208 is mechanically and electrically coupled to circuitry provided within the module 200. The beam leads 208 may extend from other surfaces of the module 200 and may be bent or configured as needed.

Figure 3A:
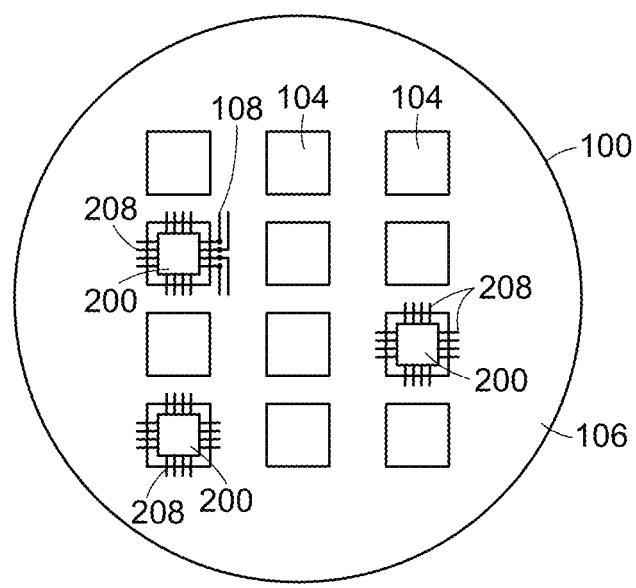
FIGS. 3A-3C are representations of modules positioned in the first substrate in accordance with an aspect of the present disclosure.
Figure 3B:
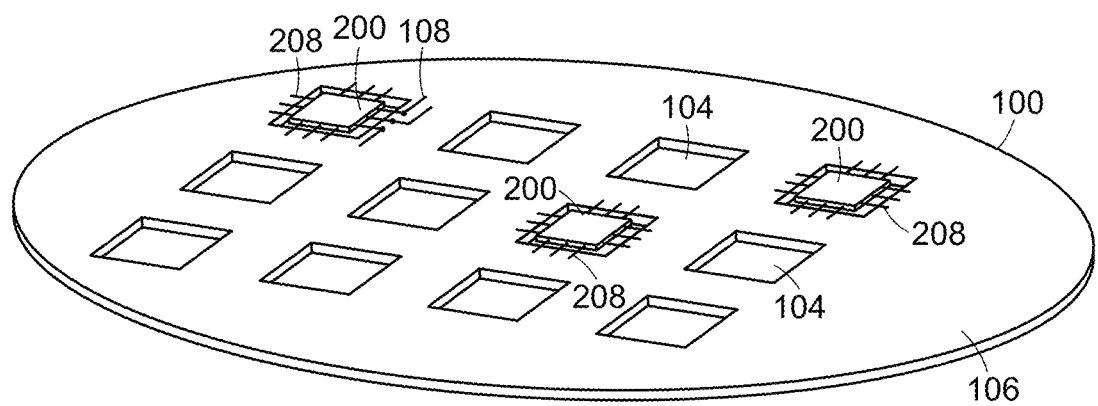
Figure 3C:
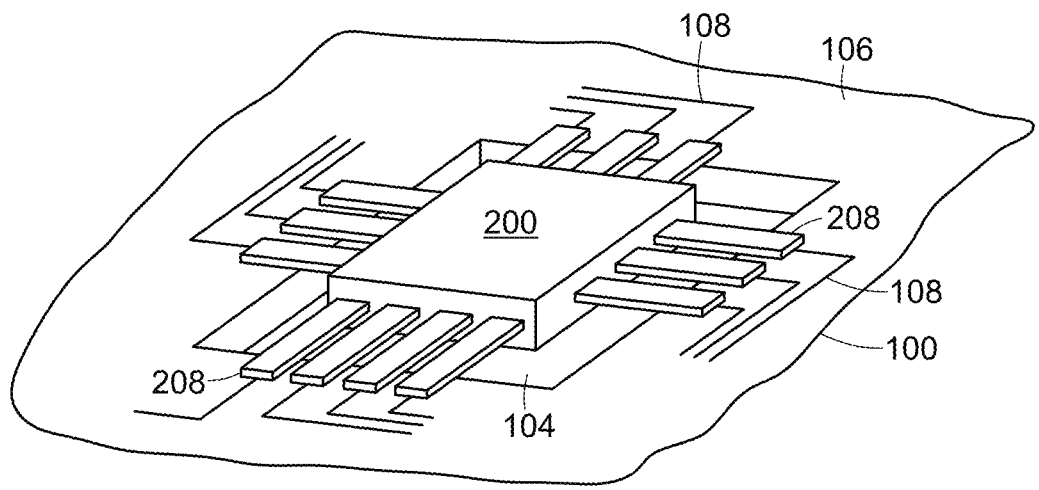

As shown in FIGS. 3A-3C, a module 200 is positioned in each aperture 104. The beam leads 208 are coupled to respective pads on the surface 106 to contact a respective trace 108. The coupling may be accomplished by soldering or other techniques as known to those of ordinary skill in the art. Depending on the design needs, not all apertures 104 may be provided with a respective module 200 but each could be, although not shown as such in the drawings for clarity.

Figure 4:
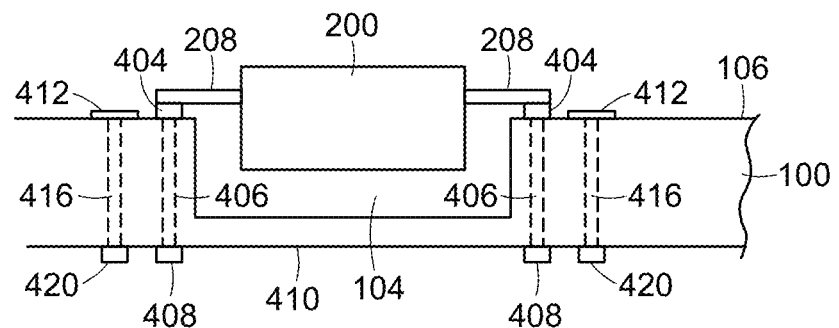
FIG. 4 is a cutaway side-view of a module positioned in an aperture in the first substrate in accordance with an aspect of the present disclosure.

The beam leads 208 operate to suspend, or otherwise position, the module 200 in a respective aperture 104, as shown in FIG. 4, a cutaway side view of one aperture 104, more specifically, an aperture 104 implemented as a cavity in that it is closed at the bottom. Each beam lead 208 may be coupled to a top surface pad 404, coupled to a via 406 that is coupled to a bottom surface pad 408 on a bottom surface 410 in order to pass a signal from the module 200. Similarly, other pads 412, with respective vias 416 and bottom surface pads 420, may be used to pass I/O signals from the upper surface 106 to the bottom surface 410 for access and functionality, as per known techniques.

Figure 5:
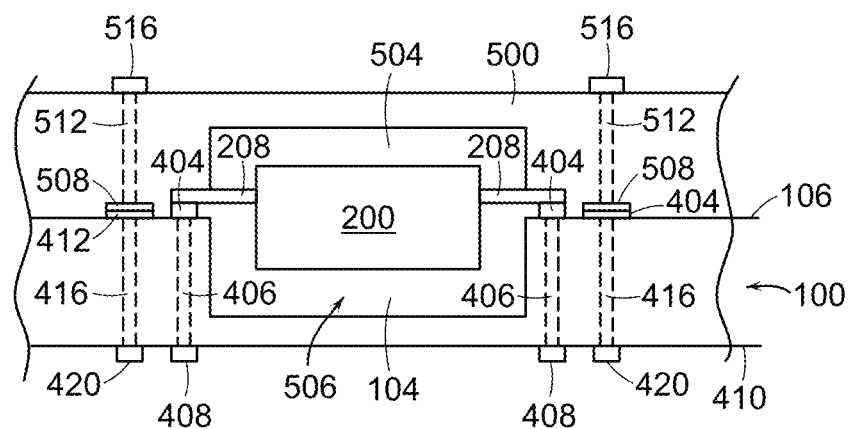
FIG. 5 is a cutaway side-view of a module positioned in the aperture of the first substrate as in FIG. 4 with a second substrate positioned over in accordance with an aspect of the present disclosure.

Referring now to FIG. 5, a lid or covering structure 500 of a shape and size corresponding to the first structure 100 is coupled to the upper surface 106 of the first structure 100. The covering structure 500 includes a covering aperture 504 for each aperture 104 of the first structure 100 to create an enclosure or space about the respective module 200. Using procedures known to one of ordinary skill in the art, the enclosure creates a hermetically sealed space 506 around each module 200. The covering structure 500 may include a pad 508, with a respective via 512 and a surface pad 516, for gaining access to signals from the module 200 as known. While a single sealed space 506 is shown, it is readily understood that multiple spaces 506, each with a corresponding module 200, could be "stacked" or arranged.

Figure 6:
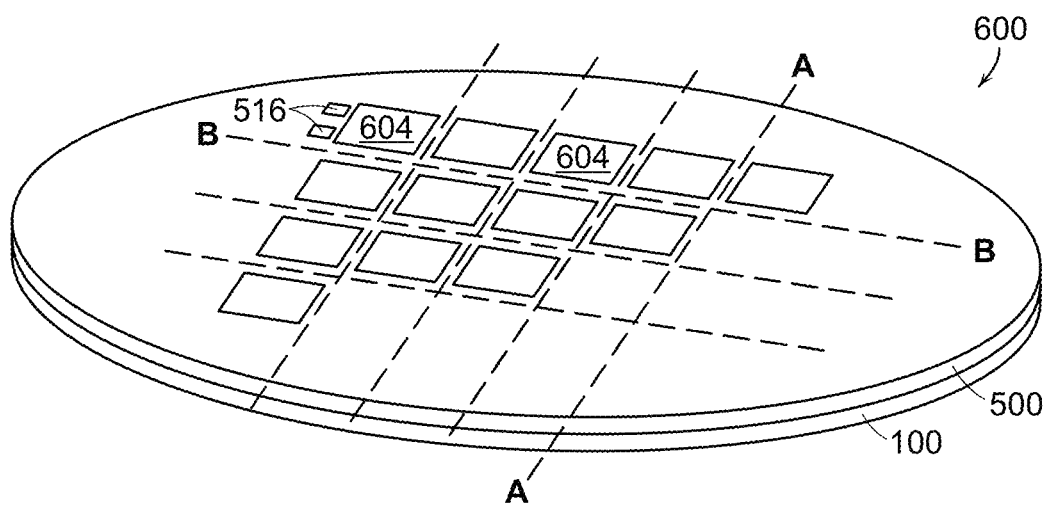
FIG. 6 is a perspective view of a reconstituted wafer structure with respect to FIGS. 4 and 5 in accordance with an aspect of the present disclosure.

As a result, a "reconstituted" wafer 600 includes the covering structure 500 over the first structure 100, as shown in FIG. 6. In addition, functional circuits 604 may be provided on the upper surface of the covering structure 500 where there may be one or more circuits 604 per module 200 within. Wafer scale processing can then be used, e.g., DBI, DBH processes using SiGe, CMOS and RW, for the final product. Using known techniques, the wafer 600 may be cut, along lines A-A and B-B and result in individual devices.

Figure 7:
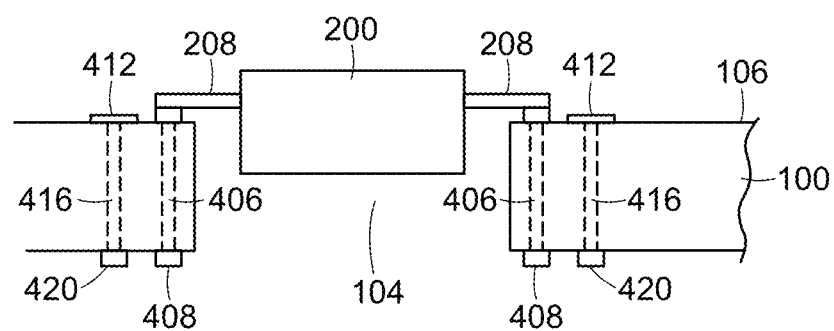
FIG. 7 is a cutaway side-view of a module positioned in an aperture in the first substrate in accordance with another aspect of the present disclosure.

Referring now to FIG. 7, in a configuration where the aperture 104 is an opening, the beam leads 208 still operate to suspend, or otherwise place, the module 200 in the respective aperture 104. As above, each beam lead 208 may be coupled to a top surface pad 404, coupled to a via 406 that is coupled to a bottom surface pad 408 on a bottom surface 410 in order to pass a signal from the module 200. Similarly, other pads 412, with respective vias 416 and bottom surface pads 420 may be used to pass signals from the upper surface 106 to the bottom surface 410 for access.

Figure 8:
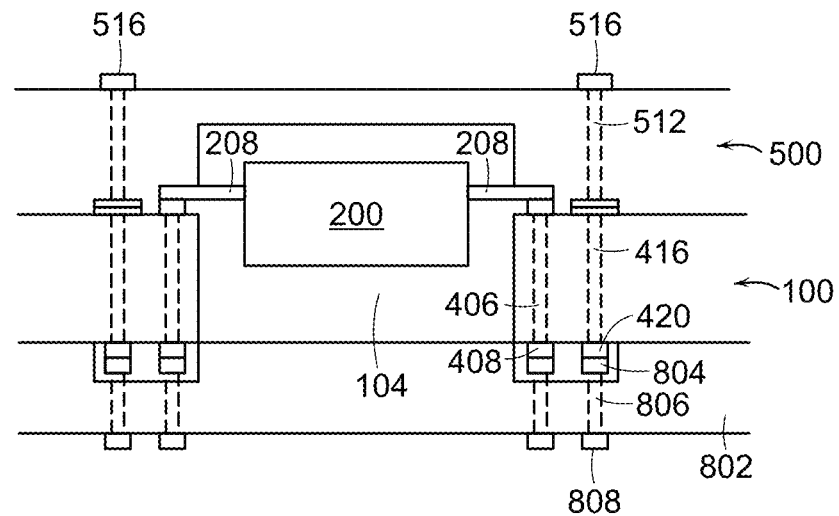
FIG. 8 is a cutaway side-view of a module positioned in the aperture of the first substrate as in FIG. 7 with a second substrate positioned over in accordance with an aspect of the present disclosure.

Referring now to FIG. 8, similar to the embodiment shown in FIG. 5, the covering structure 500 corresponding to the first structure 100 is coupled to the upper surface 106 of the first structure 100. The covering structure 500 includes a covering aperture 504 for each aperture 104 of the first structure 100 to create an enclosure about the respective module 200. Using procedures known to one of ordinary skill in the art, the enclosure creates a hermetically sealed space around each module 200. The covering structure 500 may include a pad 508, with a respective via 512 and a surface pad 516, for gaining access to signals from the module 200 as known.

In addition, a bottom structure 802, corresponding in shape to the first structure 100 is positioned to close the aperture 104 and create a hermetically sealed space. Similar to that which is described above, pads 804, vias 806 and lower pads 808 are provided to gain access to signals from the module 200.

Figure 9:
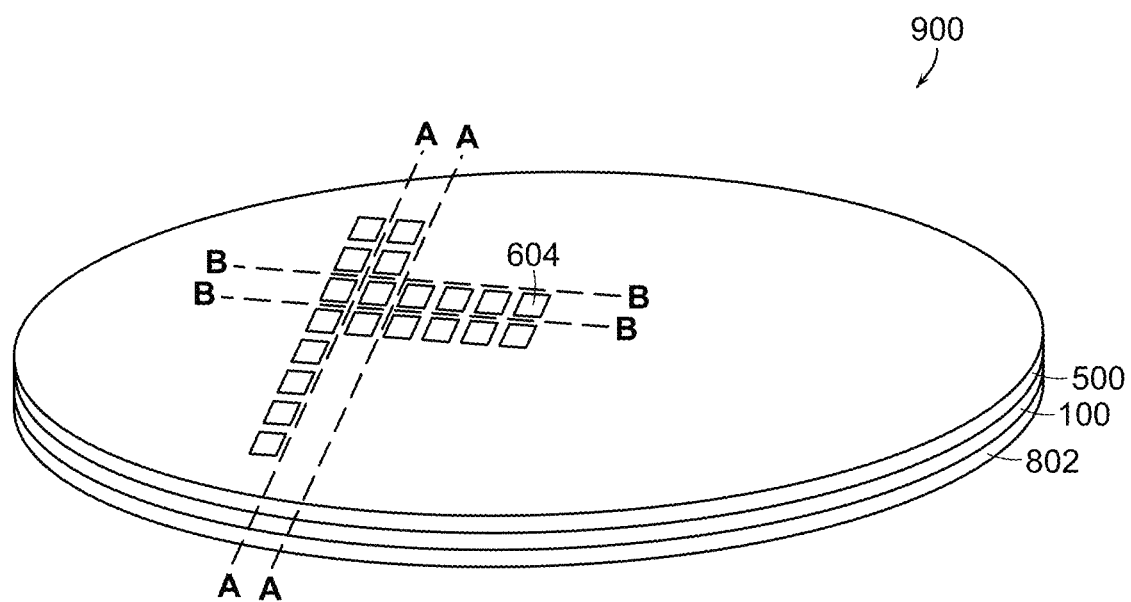
FIG. 9 is a perspective view of a reconstituted wafer structure with respect to FIGS. 7 and 8 in accordance with an aspect of the present disclosure.

An alternate "reconstituted" wafer 900, as shown in FIG. 9 includes the covering structure 500 over the first structure 100 with the bottom structure 802 below. In addition, functional circuits 604 may be provided on the upper surface of the covering structure 500 where there is one or more circuit 604 per module 200 within. Using known techniques, the wafer 900 may be cut, along lines A-A and B-B and result in individual devices.

Figure 10:
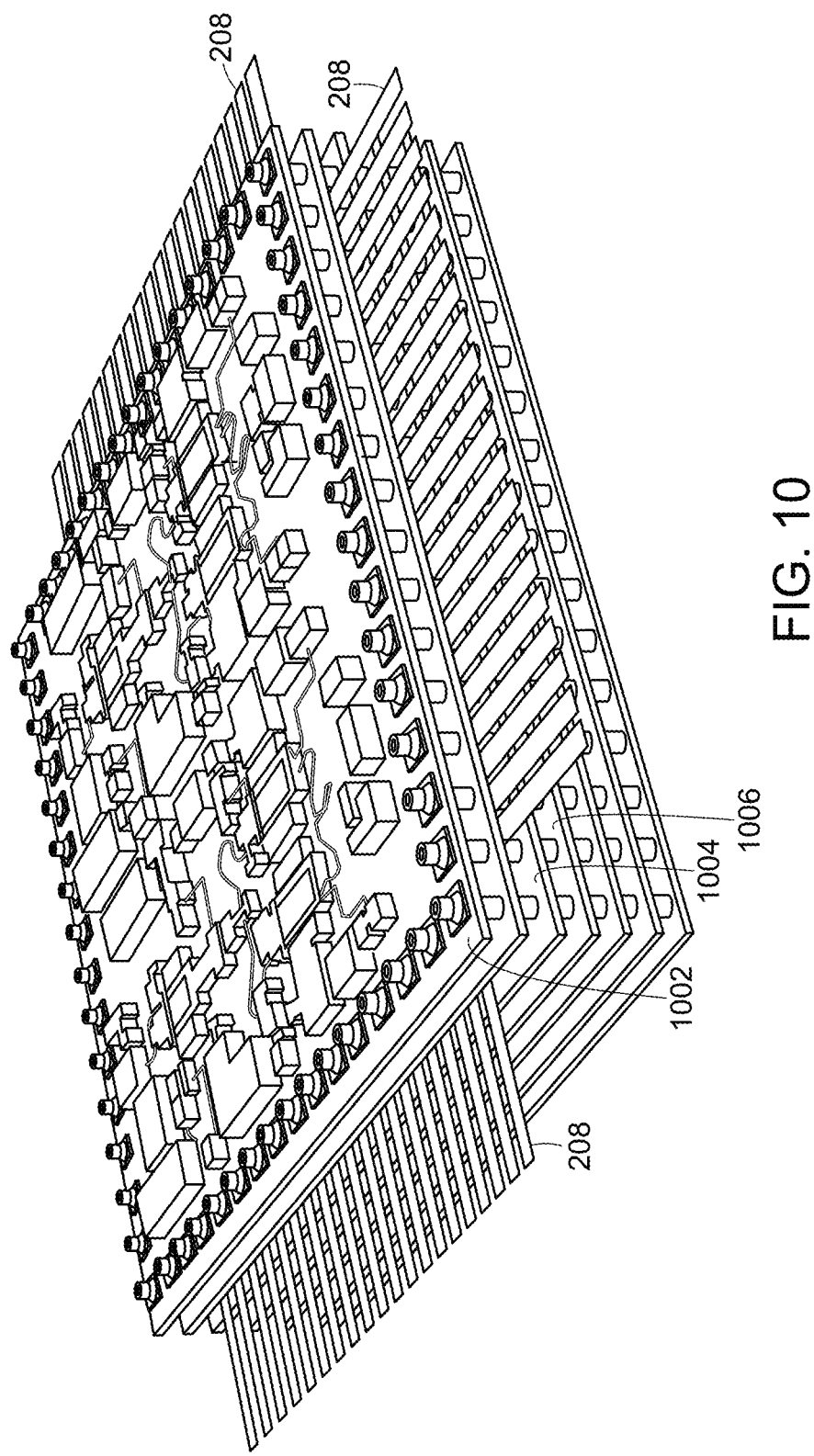
FIG. 10 is a perspective view of an invariant die in accordance with an aspect of the present disclosure.

Referring now to FIG. 10, in one aspect of the present disclosure, the module 200 may comprise an invariant die 1000. An invariant die may be a III-V vertical stack, i.e., a three-dimensional (3-D) stack, of components of different technologies, e.g., GaN, InP HEMT, HBT, GaAs, etc., connected together, as understood by one of ordinary skill in the art. In one non-limiting example, connections vertically through the stack may be made with bumps or compression techniques. As shown, a number of beam leads 208 are provided and used in accordance with the foregoing description. That is, connection off of the stack is through the beam leads 208. Each level 1002, 1004, 1006 of the invariant die 1000 includes circuit components coupled together to provide some function or functions. Further, and as an option, top and bottom contacts (not shown) running though the stack may be available on the lowest tier (circuit) and the top tier (circuit). Using known die processes, the invariant die may be on the order of a few mm on each side.

Figure 11:
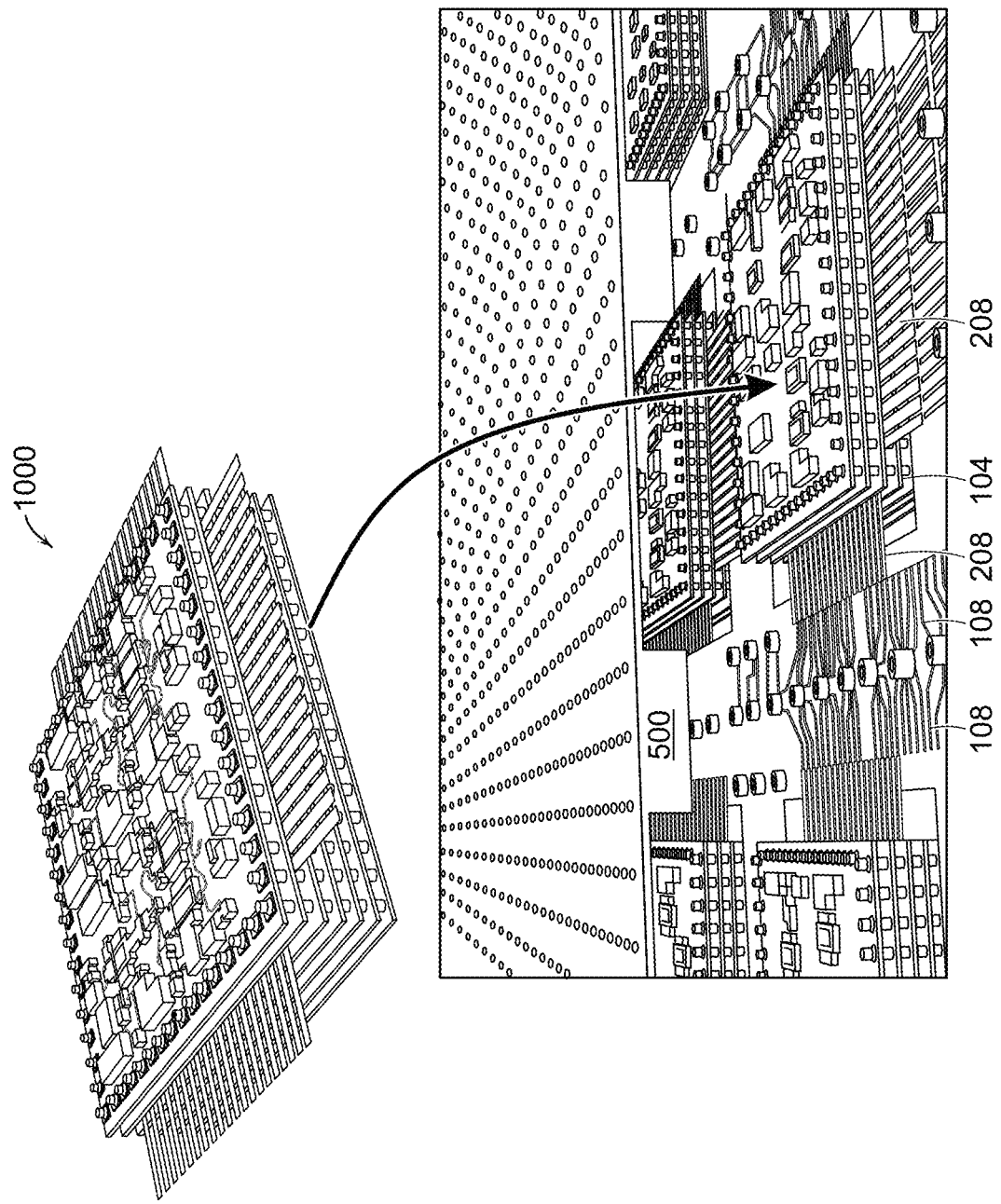
FIG. 11 represents the positioning of the invariant die of FIG. 10 in a reconstituted wafer in accordance with an aspect of the present disclosure.

Similar to the description above, an invariant die 1000 may be encapsulated into an aperture 104 of a planar first structure 100, e.g., a Silicon wafer, as shown in FIG. 11. A lid 500 is provided to hermetically seal the die 1000 in the space between the wafer 100 and the lid 500 to, advantageously, provide the reconstituted wafer, described above, with complete Au encapsulation and accessible to enlarged wafer scale processing. Advantageously, the Au encapsulation permits the reconstituted wafer to be used in a Silicon based foundry. As is known, Silicon fabrication facilities need to reduce, if not eliminate, the presence of Au as it can penetrate the Si and affect performance. In the reconstituted wafer of the present disclosure, the any die that has Au in it is sealed so it can be processed easily in Silicon fabrication facilities.

Figure 12:
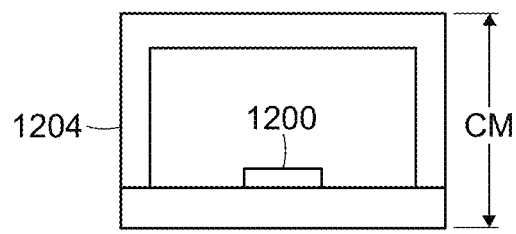
FIG. 12 is a side view of a known enclosure of a MMIC.

It has been observed that incorporating an MMIC circuit 1200 inside a package 1204 results in electromagnetic coupling of signals that can degrade performance. Past approaches to reducing this coupling have included providing RF absorbing materials in the lid of the package resulting in a package with a height on the order of centimeters, as shown in FIG. 12. Alternatively, the metal package lids have been shaped in order to suppress various modes. In addition, multilayer resistive electromagnetic bandgap (EBG) structures in low-temperature co-fired ceramic (LTCC) have shown promise. However, none of these provides a compact solution.

Accordingly, in one aspect of the present disclosure, mode suppression in a reconstituted wafer assembly as described herein accommodates existing die or MMIC circuit.

Figure 13:
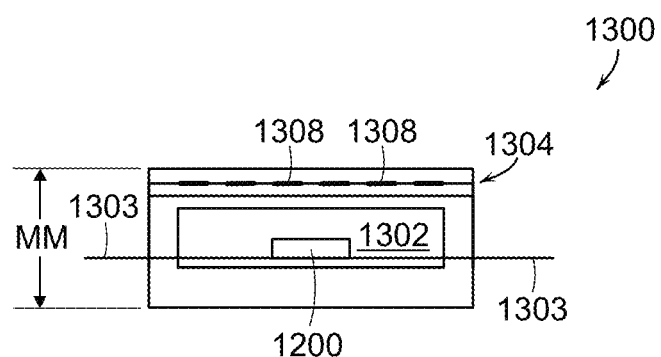
FIG. 13 is a side view of a MMIC enclosure with improved mode suppression in accordance with an aspect of the present disclosure.

Referring generally to FIG. 13, an assembly 1300 defines a cavity 1302 including a MMIC 1200 with its leads 1303 extending therefrom. The MMIC 1200 may comprise a plurality of layers of components. A lid 1304 includes a plurality of unit cells 1308, as will be described below.

Figure 14:
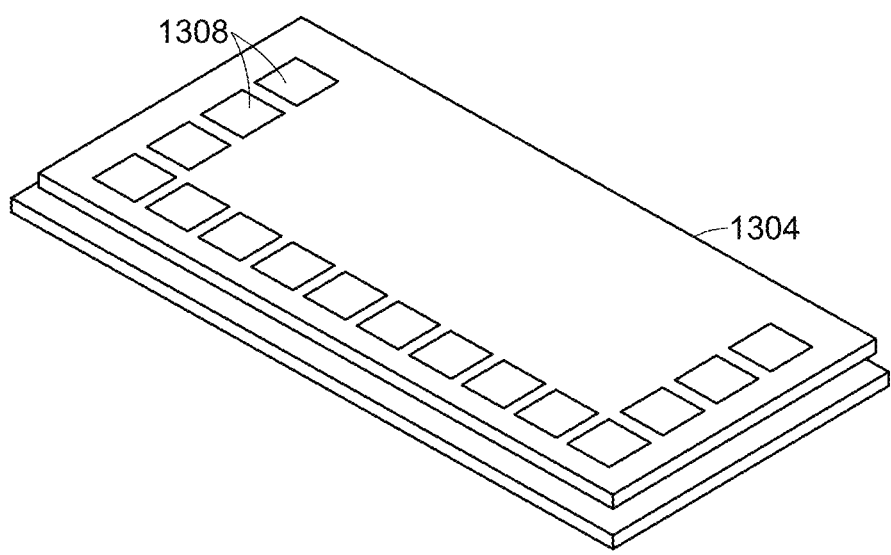
FIG. 14 is a cut away top view of the enclosure of FIG. 13.

The unit cells 1308, as shown in FIG. 14, include patterns and passive elements to form an electronic band gap surface and cavities for mode suppression. Dynamic mode suppression is provided through active EBG circuits comprising diodes and transistors. Further, feedback coupling methods between the mode-suppression circuit and the MMIC 1200 provide for dynamic mode suppression based on required performance from the die, e.g., high or low power operation.

Advantageously, the unit cells 1308 provide for a reduction of EM coupling of the module 200 with its surrounding in a reconstituted wafer assembly and reduces the need for high lid space with no impact on performance of the package.

Figure 15:
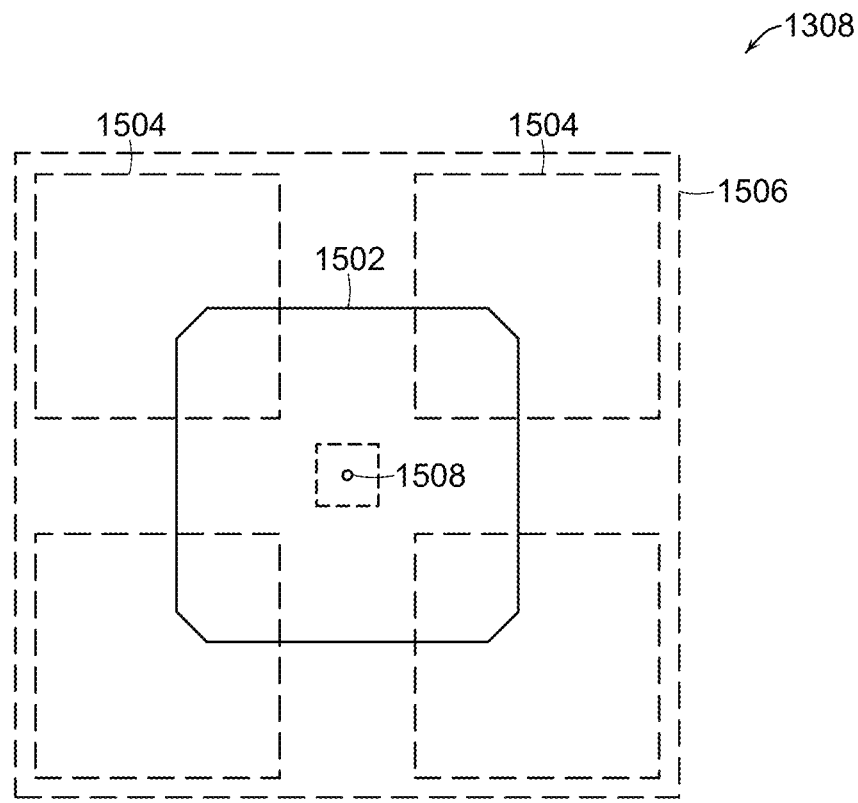
FIG. 15 is a top view of unit cells provided in a lid of the enclosure of FIG. 13 in accordance with an aspect of the present disclosure.
Figure 16:
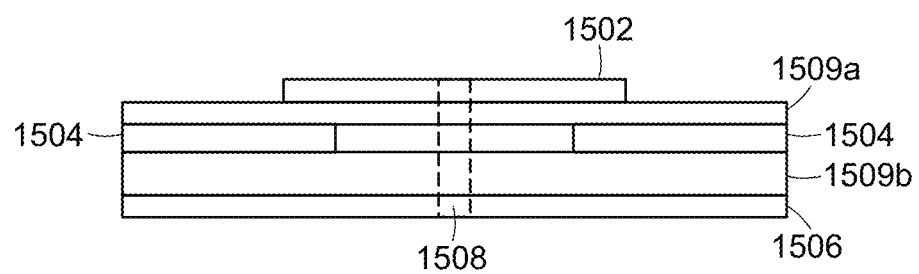
FIG. 16 is a side view of the unit cell of FIG. 15.
Figure 17:
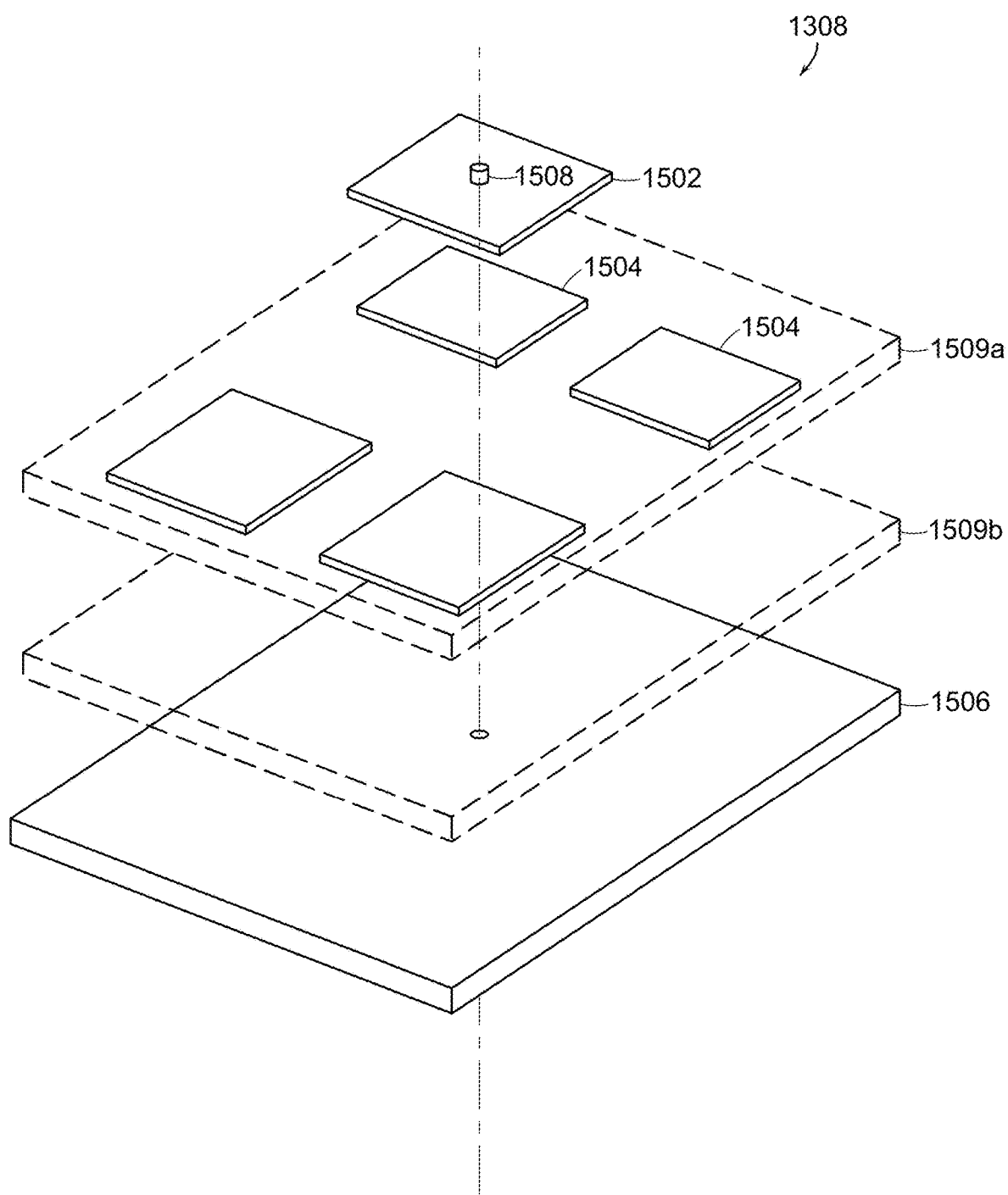
FIG. 17 is an exploded view of the unit cell of FIG. 16.

As shown in FIG. 15, with a cross-section shown in FIG. 16, each unit cell 1308 includes a top plate 1502, mid plates 1504 and a back plate 1506. The top plate 1502 and the back plate 1506 are electrically coupled by a via 1508 and may each be made of Au. The mid plates may be made of NiCr. The unit cells 1308 may be made by providing the top plate 1502, mid plates 1504 and the back plate 1506 on a multilayer SiC-based structure 1509a, 1509b, as is known to those of skill in the art. Such a configuration allows for the lid to be as close as 100 μm from the MMIC 1200. Thus, in one aspect of the present disclosure, the lid 1304 can be characterized as containing a plurality of 3-D unit cells 1308 each comprising a square gold pad 1502 with a via 1508 through the substrate 1509a, 1509b leading to a four-cornered resistive NiCr layer 1504. An exploded view of the unit cell 1308 is presented in FIG. 17.

Figure 18:
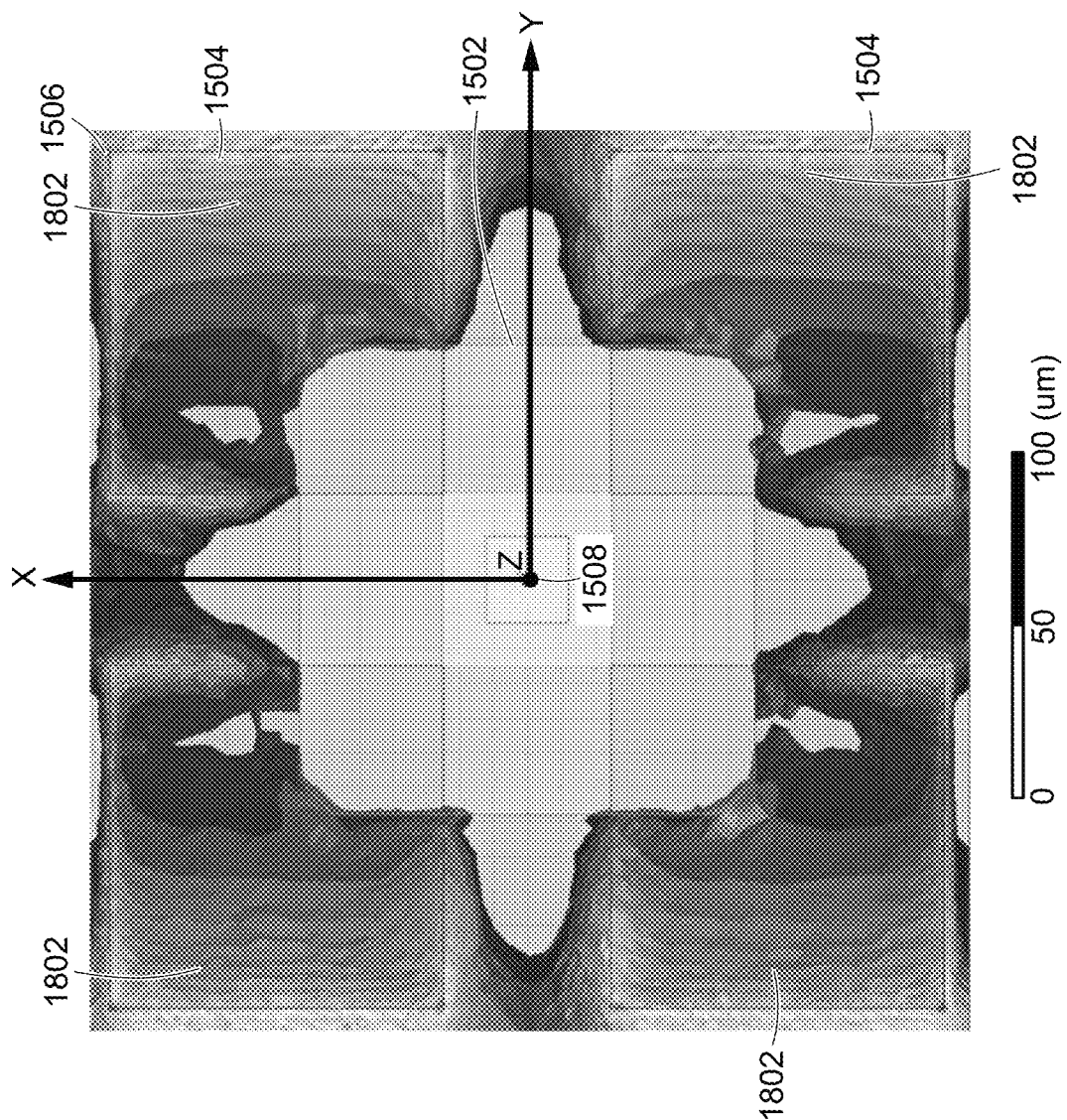
FIG. 18 is an electric field intensity graph of a mode of operation of the unit cell of FIG. 16.

As shown in FIG. 18, a plot of the electric field intensity reflects that it is highest at the edges 1802 where the NiCr resistors 1504 are located. The NiCr resistors are part of the fabrication and deposited using known metal deposition processes. It is all integrated Thus, a well matched absorbing circuit at the desired frequency is provided. In addition, the placement of the NiCr resistor pads at the location of the highest electric field intensity enables the overall broadband high absorbency function of the circuit. Advantageously, as the high intensity fields lie in the NiCr pads any modes are quickly terminated within the structure.

In the foregoing description, the circuits within the module 200 are coupled to the pads via the beam leads 208.

Known approaches to addressing the issues of beam lead coupling have included multilayer stripline transmission lines using stacked Alumina substrates or PCB forming enclosures around an RF line embedded with dielectric. This approach, however, generally has higher loss than is acceptable and coarse geometry. Others have tried three-dimensional manufactured interconnects using copper or Ni based patterned layers forming metal and dielectric layers. While this approach may be highly efficient and have low loss, the format is large and does not provide for integrated passive devices such as resistors and capacitors.

In one aspect of the present disclosure, a modulated, air-filled and suspended stripline (MASS) transmission line is implemented that reduces associated insertion loss of interconnects and increases the Isolation between various interconnects at RF and DC. In addition, the MASS transmission line enables overlapping RF lines thus increasing interconnect density and enables high power transmission capability with integrated thermal spreading. Advantageously, compact transitions to various devices and interfaces are possible.

Figure 19:
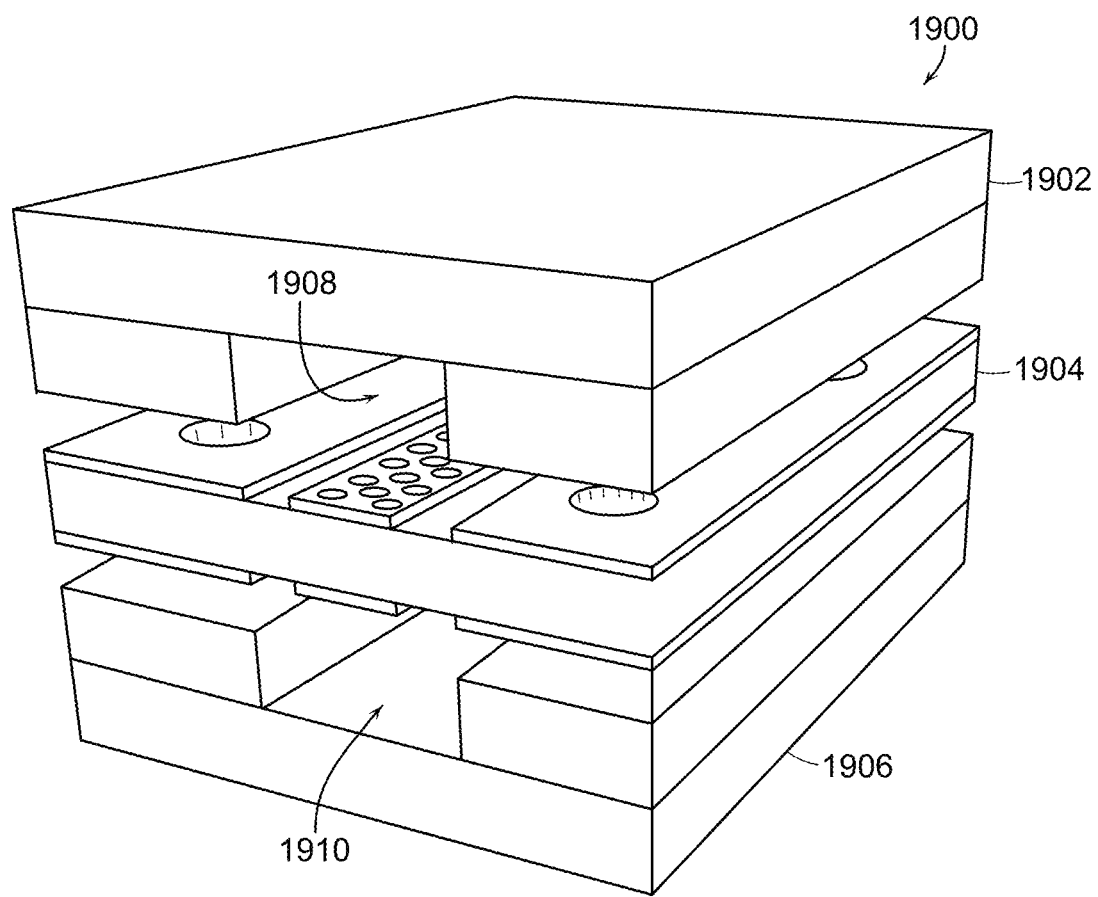
FIG. 19 is an isometric view of a modulated, air-filled and suspended stripline (MASS) transmission line structure in accordance with an aspect of the present disclosure.

Referring now to FIG. 19, an air-filled and suspended stripline (MASS) transmission line structure 1900 includes a top layer 1902, a transmission layer 1904 and a bottom layer 1906, each made from a low-loss dielectric such as SiC. A top cavity 1908 is defined between the top layer 1902 and the transmission layer 1904 and a bottom cavity 1910 is defined between the transmission layer 1904 and the bottom layer 1906.

Figure 20:
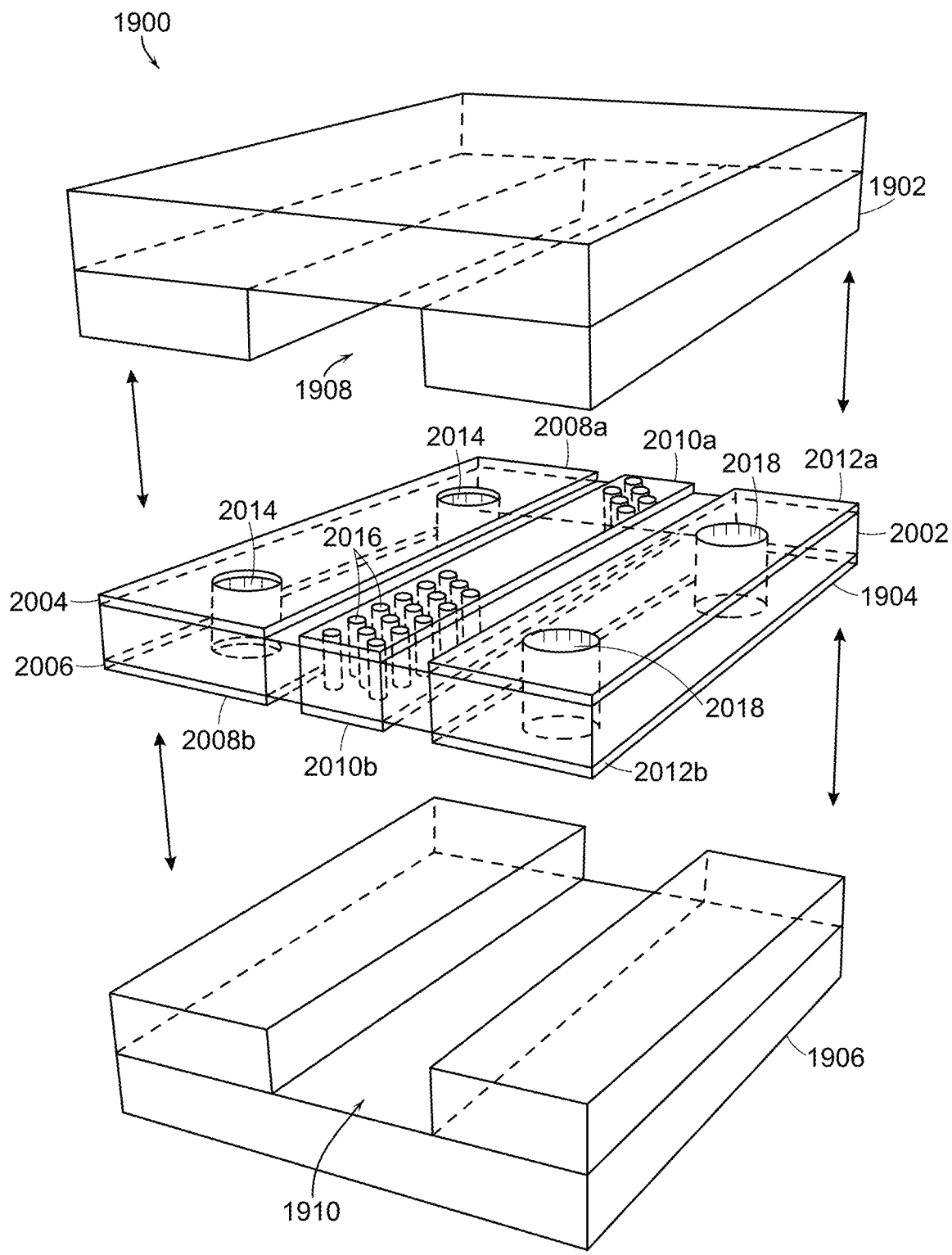
FIG. 20 is an exploded view of the MASS transmission line structure of FIG. 19.

The transmission layer 1904, referring to FIG. 20, includes a substrate 2002 made from a dielectric material having a substrate upper surface 2004 and a substrate lower surface 2006. An upper left side conductor 2008a is provided on the upper surface 2004 and a corresponding lower left side conductor 2008b is provided on the lower surface 2006. An upper central conductor 2010a is provided on the upper surface 2004 and a corresponding lower central conductor 2010b is provided on the lower surface 2006. An upper right side conductor 2012a is provided on the upper surface 2004 and a corresponding lower right side conductor 2012b is provided on the lower surface 2006. The central conductors 2010a, 2010b are aligned with the top and bottom cavities 1908, 1910. The conductors are made of various low-loss conducting metals such as Au, copper, Al and others, as available and known to those of ordinary skill in fabrication of such structures, deposited on the substrate 2002 per known techniques.

Figure 21:
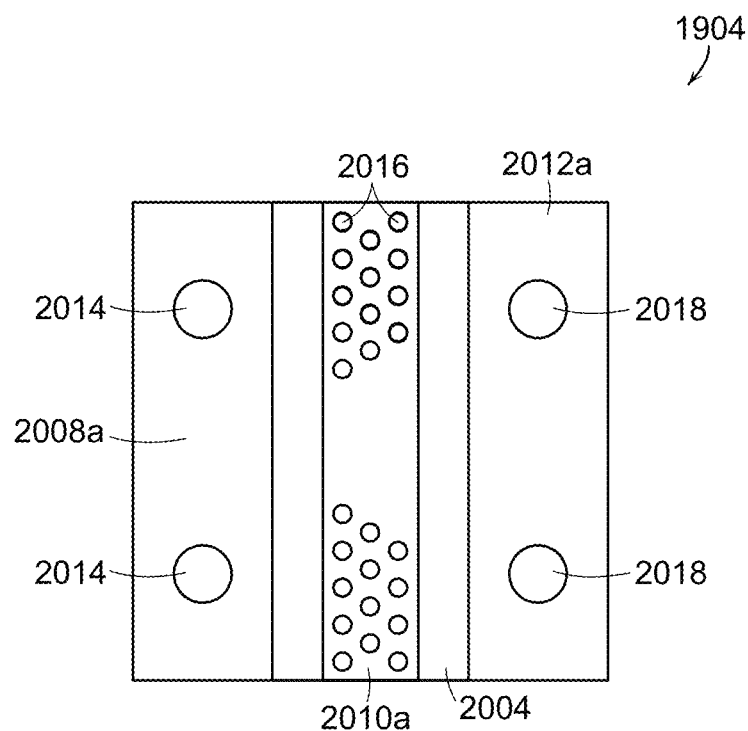
FIG. 21 is a top view of a transmission layer of the MASS transmission line of FIG. 19.

The upper left side conductor 2008a and the corresponding lower left side conductor 2008b are coupled to each other by a plurality of left side vias 2014. Similarly, the upper central conductor 2010a and the corresponding lower central conductor 2010b are coupled to one another by a plurality of central vias 2016. Finally, the upper right side conductor 2012a and the corresponding lower right side conductor 2012b are coupled to one another by a plurality of right side vias 2018. The vias are introduced per known techniques. A top view of the transmission layer 1904 is presented in FIG. 21.

In operation, a signal travels along the conductors on the transmission layer 1904. The conductor structures on the transmission layer 1904 function as a coplanar waveguide (CPW). Advantageously, as an effective width of each of the central conductors 2010a, 2010b is much larger than each conductor's height the insertion loss of the transmission line is reduced.

It should be noted that, where used, "top," "bottom," "upper," "lower," etc., are merely for explaining the relative placement of components described herein. These relative placement descriptions are not meant to limit the claims with respect to a direction of gravity or a horizon.

The present disclosure is illustratively described above in reference to the disclosed implementations. Various modifications and changes may be made to the disclosed implementations by persons skilled in the art without departing from the scope of the present disclosure as defined in the appended claims.

What is claimed is:

1. A wafer structure comprising:
   a first planar structure having a plurality of apertures defined therein;
   at least one module positioned with respect to one of the apertures of the plurality of apertures, the at least one module having a plurality of beam leads coupled to the first planar structure; and
   a second planar structure disposed on a first surface of the first planar structure to define a closed space about the at least one module,
   wherein the at least one module comprises:
      a first circuit layer;
      a second circuit layer coupled to the first circuit layer;
      a lid; and
      at least one mode suppression circuit, configured to provide passive mode suppression, disposed in the lid, the at least one mode suppression circuit comprising at least one cavity and a plurality of passive elements configured to form a passive electronic band gap surface, each passive element comprising a cell structure,
   wherein the cell structure comprises:
      a top layer comprising an electrically conductive pad;
      a middle layer comprising a plurality of electrically resistive pads;
      a lower layer comprising electrically conductive material; and
      a via electrically coupling the top layer electrically conductive pad to
   the lower layer electrically conductive material, and
   wherein at least one of the first and second circuit layers is coupled to at least one beam lead of the plurality of beam leads.

2. The wafer structure of claim 1, wherein each electrically conductive pad comprises Au.

3. The wafer structure of claim 1, wherein each electrically resistive pad comprises NiCr.

4. The wafer structure of claim 1, wherein the electrically conductive material comprises Au.

5. A device, comprising:
   a first planar structure having a first surface;
   a first aperture defined in the first surface of the first planar structure;
   a first module having a plurality of co-planar leads extending therefrom, wherein the plurality of co-planar leads is coupled to the first surface of the first planar structure to position the first module in the first aperture;
   a second planar structure disposed on the first surface of the first planar structure,
   wherein a closed space is defined about the first module by the first and second planar structures and the first aperture,
   wherein the first module comprises:
      a lid; and
      at least one mode suppression circuit, configured to provide passive mode suppression, disposed in the lid, the at least one mode suppression circuit comprising at least one cavity and a plurality of passive elements configured to form a passive electronic band gap surface, each passive element comprising a cell structure, and
   wherein the cell structure comprises:
      a top layer comprising an electrically conductive pad;
      a middle layer comprising a plurality of electrically resistive pads;
      a lower layer comprising electrically conductive material; and a via electrically coupling the top layer electrically conductive pad to the lower layer electrically conductive material.

6. The device of claim 5, wherein each electrically conductive pad comprises Au.

7. The device of claim 5, wherein each electrically resistive pad comprises NiCr.

8. The device of claim 5, wherein the electrically conductive material comprises Au.

* * * * *